United States Patent
Park

(10) Patent No.: US 6,169,504 B1
(45) Date of Patent: Jan. 2, 2001

(54) DEVICE AND METHOD FOR CONVERTING ANALOG SIGNAL TO DIGITAL SIGNAL USING INTERLEAVING SAMPLING

(75) Inventor: Yong-Pal Park, Gumi (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/172,075

(22) Filed: Oct. 14, 1998

(30) Foreign Application Priority Data

Dec. 13, 1997 (KR) .................................................. 97-68515

(51) Int. Cl.[7] ...................................................... H03M 1/36
(52) U.S. Cl. ............................................. 341/141; 341/158
(58) Field of Search ................................. 341/155, 158, 341/159

(56) References Cited

U.S. PATENT DOCUMENTS

| | | | |
|---|---|---|---|
| 4,968,988 | * 11/1990 | Miki et al. | 341/141 |
| 5,302,869 | 4/1994 | Hosotani et al. . | |
| 5,448,239 | 9/1995 | Blumberg et al. . | |
| 5,534,864 | 7/1996 | Ono et al. . | |
| 5,680,133 | * 10/1997 | Komatsu | 341/141 |
| 5,856,800 | * 6/1999 | Le Pailleur et al. | 341/159 |

FOREIGN PATENT DOCUMENTS 0 798 863 * 10/1997 (EP) .............................. H03M 1/36

OTHER PUBLICATIONS

Microelectronics Circuits 10.11 A/D Converter Circuits, pp. 747–753, Date unknown.

* cited by examiner

Primary Examiner—Howard L. Williams

(57) ABSTRACT

A device and method for converting an analog signal into a digital signal using an interleaving sampling operation is described. The device and method includes generating multiple clock signals of the same frequency but with different phases. An input analog signal is compared against multiple reference voltages. For each phase, comparison results are transmitted and decoded into a binary representation of the input analog signal. The decoding also includes the value of the clock phase of the comparison.

28 Claims, 3 Drawing Sheets

DEVICE AND METHOD FOR CONVERTING ANALOG SIGNAL TO DIGITAL SIGNAL USING INTERLEAVING SAMPLING

BACKGROUND OF THE INVENTION

1. Field of the Invention

The present invention relates to an analog-to-digital (A/D) converter, and more particularly, to a device and method for converting an analog signal into a digital signal using an interleaving sampling method.

2. Description of the Conventional Art

A feedback-type A/D converter and a parallel/flash A/D converter are two main types of a conventional A/D converter. These types of the conventional A/D converter are discussed on pages 747–753 of *Microelectronic Circuits*, 3rd edition, 1990, by Sedra and Smith, and will be described below.

As shown in FIG. 1, the conventional feedback-type A/D converter includes a comparator 11, a counter 12, and a digital-to-analog (D/A) converter 13. The comparator 11 has a positive terminal (+) for receiving an external analog signal V1 and a negative terminal (−) for receiving a reference voltage $V_R$. The comparator 11 compares the reference voltage $V_R$ with the analog signal V1, and outputs the result to the counter 12. The counter 12 counts up or down the signal output from the comparator 11 according to a clock signal input thereto, and outputs an N-bit digital signal to an external source and the D/A converter 13 based on the count. The D/A converter 13 converts the N-bit digital signal output from the counter 12 into an analog signal, and outputs the analog signal to the comparator 11 as the reference voltage $V_R$.

Referring to FIG. 1, an operation of the conventional feedback-type A/D converter will be described. As shown therein, the comparator 11 compares the reference voltage signal $V_R$ output from the D/A converter 13 with the analog signal V1 input externally, and outputs the resultant signal to the counter 12. The comparator 11 outputs a positive-valued signal when the analog signal V1 is positive, and a negative-valued signal when the analog signal V1 is negative. For the initial comparison, the reference voltage signal $V_R$ output from the D/A converter 13 is set to zero ("0"). The counter 12 receives the signal output from the comparator 11. The counter 12 performs up-counting when the signal output from the comparator 11 is positive, and down-counting when the signal is negative. The counting operations of the counter 12 are controlled by a clock signal output from an external clock generator (not shown). Then the counter 12 generates an N-bit digital signal according to the count results. The N-bit digital signal is output to an external device and to the D/A converter 13. The D/A converter 13 converts the N-bit digital signal into an analog signal which is input to the comparator 11. The comparator 11 treats this signal as the reference voltage signal $V_R$, and compares the signal $V_R$ with the analog signal V1 input thereto.

The above-described operation is repeatedly performed, and the counter 12 outputs the digital signals (bit 1 to bit N) until the output of the comparator 11 has a value of zero ("0").

FIG. 2 shows an exemplary circuit of a conventional parallel/flash A/D converter. As shown therein, the conventional parallel/flash A/D converter includes a plurality of comparators 20 connected to each other in parallel. Each of the comparators 20 includes a negative terminal (−) for receiving an external analog signal V1, and a positive terminal (+) for receiving a reference voltage signal $V_{R1}$–$V_{R(2^n-1)}$. Each comparator 20 compares the analog signal V1 with the corresponding reference voltage $V_{R1}$–$V_{R(2^n-1)}$, and outputs the comparison result to a decoder 21. The decoder 21 decodes the signals received from the comparators 20 and outputs an N-bit digital signal.

Referring to FIG. 2, an operation of the conventional parallel/flash A/D converter will be described. As shown therein, each of the comparators 20 compares the external analog signal V1 with the corresponding reference voltage $V_{R1}$–$V_{R(2^n-1)}$ and outputs a resultant value to the decoder 21. The decoder 21 then decodes the signals output from each of the comparators 20 and outputs an N-bit digital signal. Here, the comparators 20 and the decoder 21 are driven by one clock signal output from a clock generator (not shown).

As described above, the analog signal V1 input to the conventional A/D converter is sampled through the comparison operations of the comparators 20 in accordance with one preset voltage level, i.e., a reference voltage. The decoder 21 converts the sampled analog signal into a digital signal of N-bit, and outputs the digital signal representative of the analog signal V1.

In order to generate a digital signal which is more precise than the digital signal generated by the conventional A/D converters (for example, about twice as precise as the above digital signal), as many as twice of the number of comparators used in the conventional A/D converters are needed to decrease a sampling interval. However, since the conventional A/D converters are driven by a single-phase clock signal, even with a large number of comparators, a precise digital signal may not be obtained. Further, use of a large number of comparators increases the cost of the conventional A/D converters.

SUMMARY OF THE INVENTION

Accordingly, it is an object of the present invention to provide a device and method for converting an analog signal into a digital signal using interleaving sampling and a two-phase clock generator.

It is another object of the present invention to provide a device and method for converting an analog signal into a digital signal using an N-phase clock generator for generating clock signals with N different phases.

It is further another object of the present invention to provide a device and method for generating a digital signal which has been converted from an analog signal with accuracy and precision.

To achieve the above and other objects, there is provided an A/D converter including an N-phase clock signal generator generating an N number of clock signals having N different phases, a control logic generating first, second and third control signals in accordance with the clock signals generated by the N-phase clock signal generator, a comparator unit comparing an analog signal input thereto with reference signals, a transmission unit transmitting signals output from the comparator unit in accordance with the first and second control signals, and a decoding unit decoding the signals transmitted from the transmission unit in accordance with the third control signal.

Further, there is provided a method of converting an analog signal to a digital signal, including the steps of generating an N number of clock signals having N different phases, generating first, second and third control signals in accordance with the generated clock signals, comparing an analog signal with reference voltage signals, generating comparison signals based on comparison results, transmitting the comparison signals in accordance with the generated first and second control signals, and decoding the signals transmitted from said transmitting step in accordance with the generated third control signal.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed descriptions.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

With reference to the accompanying diagrams, an interleaving sampling A/D converter according to the present invention will be described.

Figure 1:
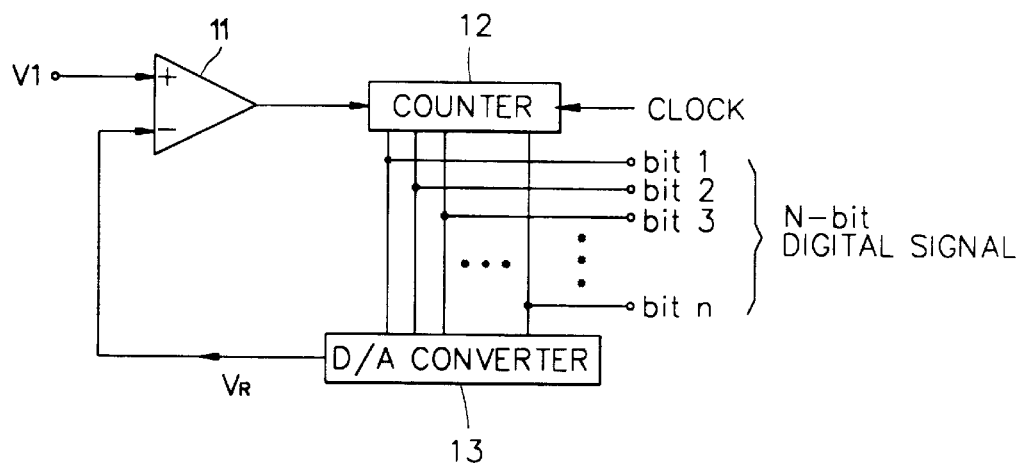
FIG. 1 is a block diagram of a conventional feedback-type A/D converter.
Figure 2:
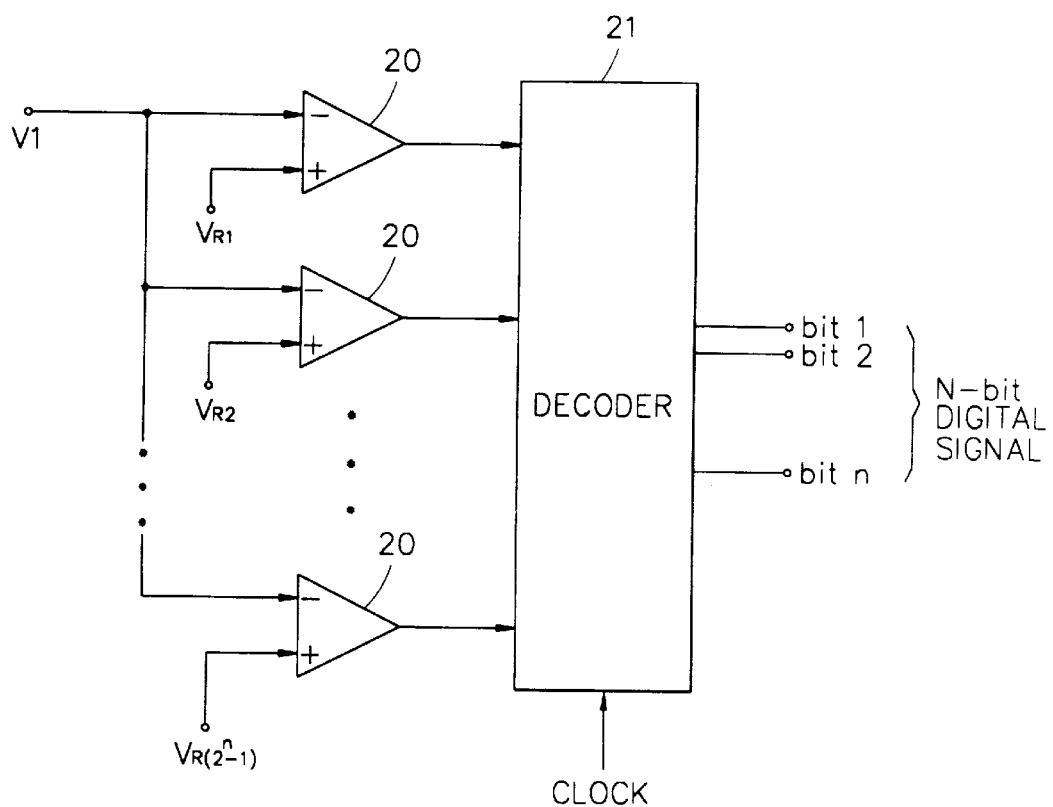
FIG. 2 is a block diagram of a conventional parallel/flash A/D converter.
Figure 3:
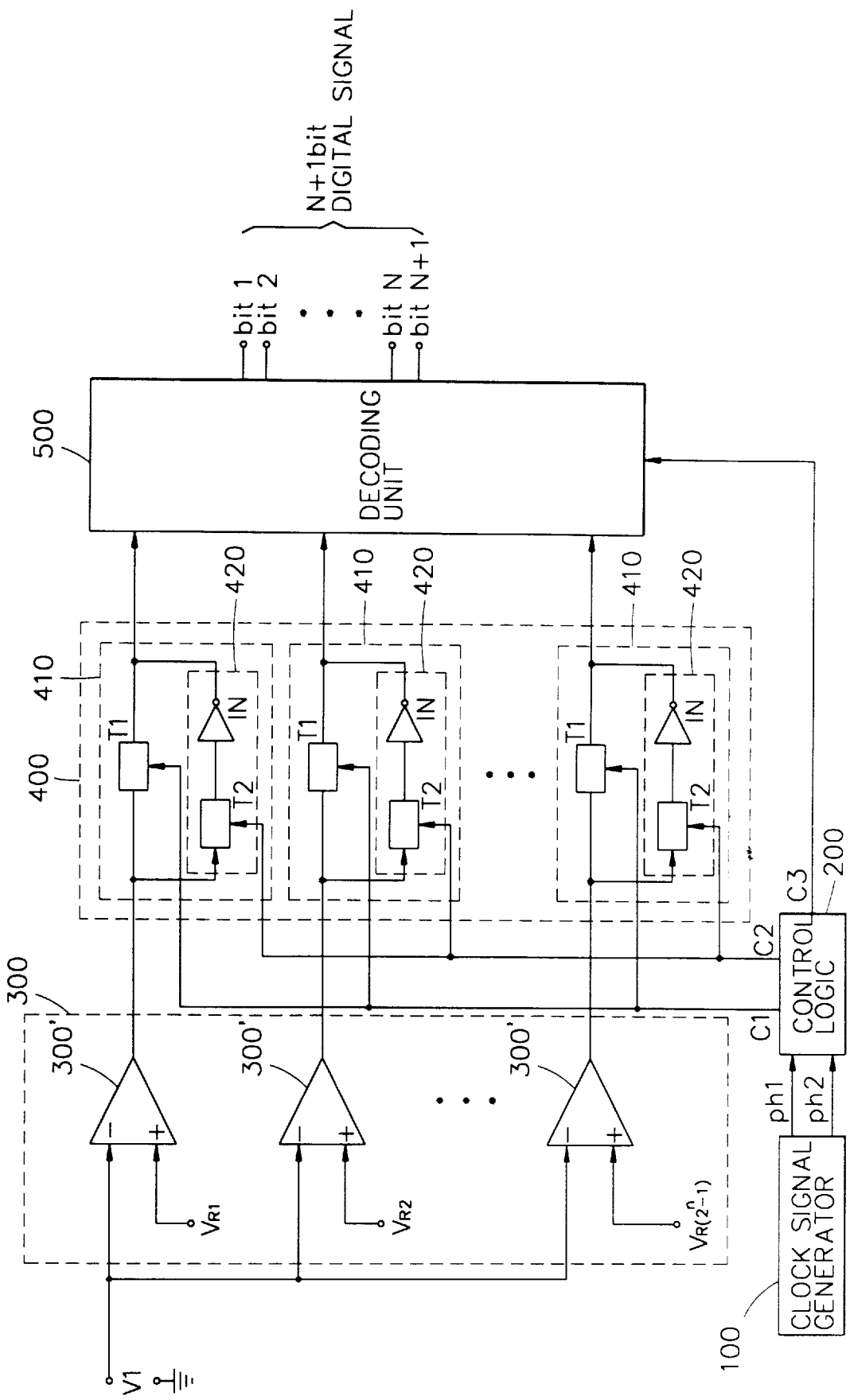
FIG. 3 is a block diagram of an interleaving sampling A/D converter according to the present invention.

FIG. 3 is a block diagram of an A/D converter according to the present invention. As shown therein, the A/D converter includes a two-phase clock signal generator 100 for generating first and second clock signals ph1, ph2 having different phases; a control logic 200 for controlling the different components of the converter in accordance with the clock signals ph1, ph2; a comparator unit 300 for comparing an externally input analog signal V1 with each of reference voltage signals $V_{R1}$–$V_{R(2^n-1)}$; a transmission unit 400 for transmitting signals output from the comparator unit 300; and a decoding unit 500 for decoding the signals transmitted from the transmission unit 400 into digital signals in accordance with a control signal of the control logic 200 and outputting the digital signals to an external device.

The comparator unit 300 includes a plurality of comparators 300' coupled to the transmission unit 400. Each of the comparators 300' has a positive (+) terminal for receiving a corresponding one of the reference voltage signals $V_{R1}$–$V_{R(2^n-1)}$, and a negative (−) terminal for receiving an analog signal V1. Here, the user determines a voltage level of each of the reference voltage signals $V_{R1}$–$V_{R(2^n-1)}$, and the reference voltage signals $V_{R1}$–$V_{R(2^n-1)}$ are output from a reference voltage generator (not shown).

The transmission unit 400 includes a plurality of transmitters 410 for transmitting the output signals of the comparators 300' to the decoding unit 500 or for inverting the output signals of the comparators 300' and transmitting the inverted signals to the decoding unit 500 under control of the control logic 200. Each of the transmitters 410 includes a first transmitting gate T1 for transmitting a signal output from a corresponding comparator 300' to the decoding unit 500 in accordance with a first control signal output from the control logic 200, a second transmitting gate T2 for transmitting the signal outputted from the corresponding comparator 300' in accordance with a second control signal from the control logic 200, and an inverter IN for inverting the signal transmitted from the second transmitting gate T2.

With reference to FIG. 3, an operation of the A/D converter according to the present invention will be described.

Each of the comparators 300' compares the corresponding reference voltage signal $V_{R1}$–$V_{R(2^n-1)}$ to the analog signal V1, outputs a positive value or a high level signal when the value of the corresponding reference voltage signal $V_{R1}$–$V_{R(2^n-1)}$ is greater than that of the analog signal V1, and outputs a negative value or a low level signal when the value of the corresponding reference voltage signal $V_{R1}$–$V_{R(2^n-1)}$ is less than that of the analog signal V1.

Each of the transmitters 410 of the transmission unit 400 receives the comparison result from the corresponding comparator 300'. The first transmitting gate T1 of each transmitter 410 transmits this signal to the decoding unit 500 in accordance with the first control signal C1 output from the control logic 200. Each second transmitting gate T2 of the transmitters 410 transmits the signal output from the corresponding comparator 300' to the corresponding inverter IN in accordance with the second control signal C2 output from the control logic 200. Each inverter IN inverts the signal output from the corresponding second transmitting gate T2 and outputs the inverted signal to the decoding unit 500.

Figure 4A:
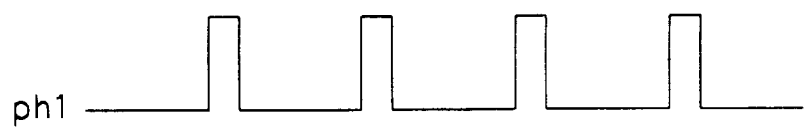
FIGS. 4A and 4B are wave diagrams respectively illustrating clock signals output from a two-phase clock generator shown in FIG. 3 according to the present invention.
Figure 4B:
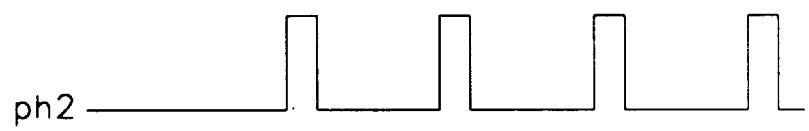

The signals transmitted from the first and second transmitting gates T1, T2, respectively, are transmitted at intervals corresponding to a time difference which equals the time difference corresponding to the phase difference between the first and second clock signals ph1, ph2, as shown in FIGS. 4A and 4B. Accordingly, the logic control 200 outputs the first, second, and third control signals C1, C2, C3 in accordance with the first and second clock signals ph1, ph2 to control the components of the present A/D converter.

The second transmitting gate T2 and the inverter IN constitute a 1's complementary conversion circuit 420, and the decoding unit 500 synchronizes the output signal of the 1's complementary conversion circuit 420 with the third control signal C3 output from the control logic 200.

Accordingly, a first sampling process is performed based on the first clock signal ph1, as shown in FIG. 4A, and then a second sampling process is performed based on the second clock signal ph2, as shown in FIG. 4B, while the first sampling process is being carried out. As a result, a more precise sampling result is obtained.

Next, the decoding unit 500 decodes the signals output from the transmission unit 400 into digital signals in accordance with the third control signal C3, and outputs the digital signals to external devices. Here, the number of bits present in the digital signal output from the decoding unit 500 is N+1. The bit N is determined by the user, and the last bit (bit N+1) of the digital signal indicates whether the digital signal is generated according to the first or second clock signal ph1, ph2. For example, when the bit N+1 has a logic zero or is a low level, the digital signal is generated according to the first clock signal ph1. When the bit N+1 has a logic one or is a high level, the digital signal is generated according to the second clock signal ph2.

The third control signal C3 to which the first and second clock signals ph1, ph2 of the two-phase clock signal generator 100 are synthesized, is output to the decoding unit 500. The decoding unit 500 synchronizes the output signals of the transmission unit 400 with the third control signal C3 and, thus, determines whether each of the digital signals is sampled according to the first or second clock signal ph1, ph2.

In addition, when an A/D conversion that is more precise than the one carried out using the two-phase clock signal generator 100 is desired, the user may substitute the two-phase clock signal generator 100 with an N-phase clock signal generator where N can be greater than two. The N-phase clock signal generator generates an N number of clock signals having N different phases. As many as N-1 1's complementary conversion circuits 420 can be provided, wherein N is the number of different phases of the clock signals.

Figure 5:
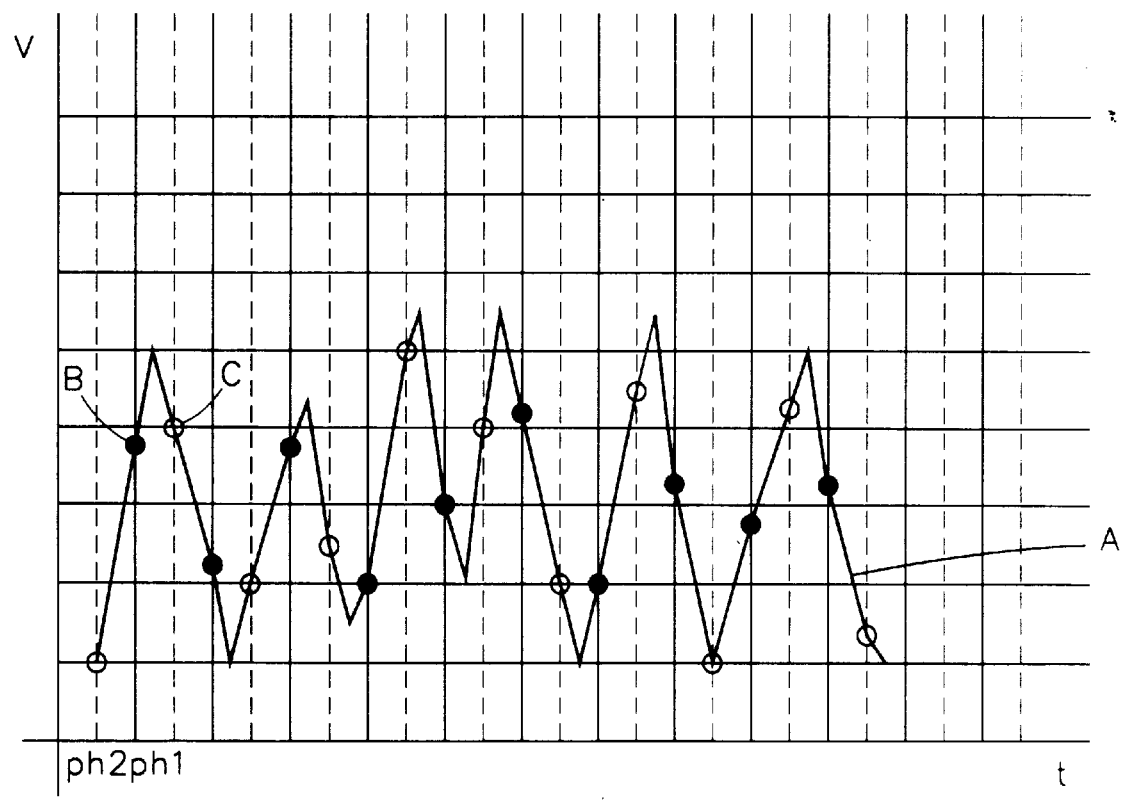
FIG. 5 is a graph illustrating an analog signal sampled by the A/D converter shown in FIG. 3.

FIG. 5 is a graph illustrating sampling of an analog signal A to generate a corresponding digital signal, wherein sample points Bs are obtained by a first sampling operation and sample points C are obtained by a second sampling operation according to the present invention. The second sampling operation may result in a more precisely converted digital signal than the first sampling operation. Due to its accurate conversion, the second sampling operation is useful for converting a non-periodic analog signal into a digital signal and re-converting the digital signal to the analog signal.

As described above, an A/D converter with interleaving sampling and a method of converting an analog signal with the A/D converter according to the present invention employ an N-phase clock generator for generating a plurality of clock signals having N different phases, so as to provide accurately converted digital signals.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. An analog-to-digital (A/D) converter, comprising:
    an N-phase clock signal generator generating a plurality of clock signals having N different phases;
    a control logic generating first, second and third control signals in accordance with the clock signals generated by the N-phase clock signal generator;
    a comparator unit comparing an analog signal input thereto with reference signals;
    a transmission unit transmitting signals output from the comparator unit in accordance with the first and second control signals output from the control logic; and
    a decoding unit decoding the signals transmitted from the transmission unit in accordance with the third control signal output from the control logic, the decoding unit outputting N+1 output signals.

2. The converter of claim 1, wherein the comparator unit comprises:
    a plurality of comparators coupled to the transmission unit, each comparator having a positive terminal for receiving a corresponding one of the reference signals, and a negative terminal for receiving the inputted analog signal.

3. The converter of claim 2, wherein each comparator compares the inputted analog signal with the corresponding one of the reference signals, and generates one of a high level signal and a low level signal according to a comparison result.

4. The converter of claim 2, wherein the transmission unit comprises:
    a plurality of transmitters coupled to the decoding unit, each transmitter receiving an output of a corresponding one of the comparators of the comparator unit.

5. The converter of claim 4, wherein each transmitter includes:
    a transmission gate for directly transmitting an output of the corresponding comparator to the decoding unit according to the first control signal of the control logic, and
    a complementary conversion circuit for inverting the output of the corresponding comparator according to the second control signal of the control logic.

6. The converter of claim 5, wherein each complementary conversion circuit includes another transmission gate and an inverter, the another transmission gate transmitting the output of the corresponding comparator to the inverter according to the second control signal, the inverter inverting an output of the another transmission gate and outputting the inverted output to the decoding unit.

7. The converter of claim 4, wherein each transmitter includes first and second transmission gates, and an inverter, the first transmission gate directly transmitting an output of the corresponding comparator to the decoding unit, the second transmission gate directly transmitting the output of the corresponding comparator to the inverter, the inverter inverting an output of the second transmission gate.

8. The converter of claim 4, wherein the transmission unit comprises an N number of the transmitters according to the clock signals having N different phases.

9. The converter of claim 2, wherein there are an N number of the comparators according to the clock signals having N different phases.

10. The converter of claim 1, wherein the N-phase clock signal generator is a two-phase clock generator generating two clock signals having different phases.

11. The converter of claim 1, wherein the $(N+1)^{th}$ bit indicates a particularly phased clock signal.

12. A method of converting an analog signal to a digital signal, comprising the steps of:
    generating a plurality of clock signals having N different phases;
    generating first, second and third control signals in accordance with the generated clock signals;
    comparing an analog signal with reference signals and generating comparison signals based on comparison results;
    transmitting the comparison signals in accordance with the generated first and second control signals; and
    decoding the signals transmitted from said transmitting step in accordance with the generated third control signal and outputting N+1 output signals.

13. The method of claim 12, wherein said comparing step includes the step of:
    providing a plurality of comparators, each comparator having a positive terminal for receiving a corresponding one of the reference signals, and a negative terminal for receiving the analog signal.

14. The method of claim 13, wherein said comparing step further includes the steps of:

comparing, in each of the comparators, the analog signal with the corresponding one of the reference signals; and generating, by each of the comparators, one of a high level signal and a low level signal according to a comparison result.

15. The method of claim 13, wherein said transmitting step includes the step of:

providing a plurality of transmitters coupled to the comparators, each transmitter receiving an output of a corresponding one of the comparators.

16. The method of claim 15, wherein in said step of providing the transmitters, each transmitter includes a transmission gate for directly transmitting the output of the corresponding comparator for said decoding step according to the first control signal, and a complementary conversion circuit for inverting the output of the corresponding comparator according to the second control signal.

17. The method of claim 16, wherein in said step of providing the transmitters, each complementary conversion circuit includes a transmission gate and an inverter, the transmission gate transmitting the output of the corresponding comparator to the inverter according to the second control signal, the inverter inverting an output of the transmission gate.

18. The method of claim 13, wherein said transmitting step includes the steps of:

directly transmitting outputs of the comparators according to the first control signal; and inverting the outputs of the comparators according to the second control signal.

19. The method of claim 13, wherein in said step of providing the comparators, there are N number of comparators according to the plurality of clock signals having N different phases.

20. The method of claim 12, wherein said step of generating the plurality of clock signals includes the step of:

generating an N number of clock signals using an N-phase clock generator.

21. The method of claim 20, wherein in said step of generating the N number of clock signals, said N is two (2).

22. The converter of claim 11, wherein the $(N+1)^{th}$ bit indicates a particularly phased clock signal.

23. An analog-to-digital (A/D) converter, comprising:

an N-phase clock signal generator generating a plurality N of clock signals having N different phases;

a control logic generating first and second groups of control signals in accordance with the clock signals generated by the N-phase clock signal generator;

a comparator unit comparing an analog signal input thereto with P-1 reference signals;

a transmission unit transmitting signals from the comparator unit in accordance with the first group of control signals output from the control logic; and a decoding unit decoding the signals transmitted from the transmission unit in accordance with the second group of control signals output from the control logic, the decoding unit outputting $\log_2 P + \log_2 N$ output signals.

24. The converter of claim 23, wherein bits 1 to $\log_2 P$ indicate the digital value of the analog signal and bits $\log_2 P + 1$ to $\log_2 P + \log_2 N$ indicate a particularly phased clock signal.

25. The converter of claim 23, wherein the first group of control signals comprises of N signals.

26. A method of converting an analog signal to a digital signal, comprising:

generating a plurality N of clock signals having N different phases;

generating first and second groups of control signals in accordance with the generated clock signals;

comparing an analog signal input thereto with P-1 reference signals and generating comparison signals based on comparison results;

transmitting the comparison signals in accordance with the generated first group of control signals; and decoding the signals transmitted from the transmission step in accordance with the generated second group of control signals output from the control logic and outputting $\log_2 P + \log_2 N$ output signals.

27. The method of claim 26, wherein bits 1 to $\log_2 P$ indicate the digital value of the analog signal and bits $\log_2 P + 1$ to $\log_2 P + \log_2 N$ indicate a particularly phased clock signal.

28. The converter of claim 26, wherein the first group of control signals comprises of N signals.

* * * * *